United States Patent [19]

Koyanagi et al.

[11] Patent Number: 5,341,013
[45] Date of Patent: Aug. 23, 1994

[54] SEMICONDUCTOR DEVICE PROVIDED WITH SENSE CIRCUITS

[75] Inventors: Masaru Koyanagi, Yokohama; Minoru Yamda, Kawasaki, both of Japan

[73] Assignee: Kabushiki Kaisha Toshiba, Kawasaki, Japan

[21] Appl. No.: 905,661

[22] Filed: Jun. 29, 1992

[30] Foreign Application Priority Data

Jun. 28, 1991 [JP] Japan ................... 3-158929

[51] Int. Cl.5 ........................... H01L 27/02
[52] U.S. Cl. ..................... 257/368; 257/401
[58] Field of Search ............... 257/368, 401

[56] References Cited

U.S. PATENT DOCUMENTS 5,144,388 9/1992 Sawada et al. .................. 257/401

Primary Examiner—Mark V. Prenty
Attorney, Agent, or Firm—Foley & Lardner

[57] ABSTRACT

A semiconductor device provided with a plurality of sense circuits, each sense circuit including a pair of MOS transistors such that their sources are commonly connected, and that the drain of one transistor and the gate of the other transistor are cross-coupled each other to, thus, sense a difference between potentials applied to the respective gates. The paired transistors respectively include one transistor regions, and are disposed with their source regions being shared among the plurality of sense circuits. These sense circuits are disposed in a manner to share the source regions of the respective transistors. When elimination of only isolation between sense circuits meets with a required miniaturization of the device, paired transistors constituting sense circuits may include two transistor regions or more connected in parallel, respectively.

1 Claim, 3 Drawing Sheets

SEMICONDUCTOR DEVICE PROVIDED WITH SENSE CIRCUITS

BACKGROUND OF THE INVENTION

This invention relates to a semiconductor device provided with a plurality of sense circuits using MOS transistors.

In recent years, in MOS type semiconductor memory devices, it has become common to use sense circuits to sense and read very small potential differences corresponding to the storage content of a memory cell by making use of a difference between the conductance values of a pair of MOS transistors.

The basic configuration of a conventional sense circuit is shown in FIG. 3. As shown in this figure, MOS transistors Q1 and Q2 have their sources connected in common. Also, the drain of one transistor and the gate of the other transistor are connected so that they are cross-coupled to each other. In this circuit configuration, a difference between the potentials applied to the respective gates, i.e., a difference between potentials on the nodes N1 and N2 is sensed by making use of a difference between conductance values of the MOS transistors Q1 and Q2.

An example of the pattern arrangement in the case where a plurality of sense circuits of such a configuration are formed on a semiconductor substrate is shown in FIG. 4. One sense circuit 40a comprises MOS transistors Q1 and Q2. In the pattern arrangement of FIG. 4, a plurality of such sense circuits 40a, 40b, ... are arranged. Here, a gate electrode 41 of the MOS transistor Q1 and a gate electrode 42 of the MOS transistor Q2 are ordinarily formed by a polycrystalline silicon film. Further, a drain region 43 of the MOS transistor Q1 and a drain region 44 of the MOS transistor Q2 are formed in a self-alignment manner by injecting impurity ions thereinto by using the gate electrodes 41 and 42 as a mask.

However, the conventional semiconductor device had the following problem. Namely, a plurality of sense circuits 40a, 40b, ... were arranged with element isolation regions (isolation regions between respective sense circuits) provided therebetween. For this reason, realization of a semiconductor device integrated to a high degree was obstructed. In order to realize a semiconductor device integrated to a high degree, drain/source regions (43, 44; 45) of MOS transistors provided in respective sense circuits must be miniaturized. However, when an attempt is made to miniaturize those source/drain regions, the impurity concentration becomes uneven, or contact resistance values of respective regions increase, so their values become uneven. In addition, in the case of forming respective regions, wiring layers, contact portions, etc., deviation of the mask positioning took place. As a result, there occurred unevenness in the transistor characteristic, resulting in lowered production yield or deteriorated performance.

SUMMARY OF THE INVENTION

Accordingly, an object of this invention is to provide a semiconductor device which can be integrated to high degree, and which can improve the production yield and performance.

In accordance with this invention, there is provided a semiconductor device comprising two sense circuits or more, each sense circuit including first and second MOS transistors such that their sources are commonly connected, and that the drain of one transistor and the gate of the other transistor are connected so that they are cross-coupled each other, to thus sense a difference between potentials applied to the respective gates, wherein the first and second MOS transistors include one of the transistor regions, respectively, the first and second MOS transistors being disposed with their source regions being shared among the two or more sense circuits, the two sense circuits or more being disposed in such a manner they share the respective source regions of the first and second MOS transistors that the respective sense circuits have.

Here, the first and second MOS transistors may include two transistor regions or more connected in parallel, respectively.

In accordance with the semiconductor device thus constructed, in the respective sense circuits, source regions of the first and second MOS transistors are shared, and these source regions are also shared among the respective sense circuits. As stated above, the respective sense circuits are disposed under the state shared by the source regions without being isolated by the element isolation regions. For this reason, when an attempt is made to carry out miniaturization, the source and drain regions both have a larger or broader margin in area than in the case where any element isolation region is provided between respective sense circuits. Accordingly, with this semiconductor device, the impurity concentration becomes uniform, the contact resistance becomes a small and uniform value, and there is a margin for deviation of the relative mask positioning between respective layers. Thus, production yield and performance improve.

DESCRIPTION OF THE PREFERRED EMBODIMENTS

Preferred embodiments of this invention will now be described with reference to the attached drawings.

Figure 1:
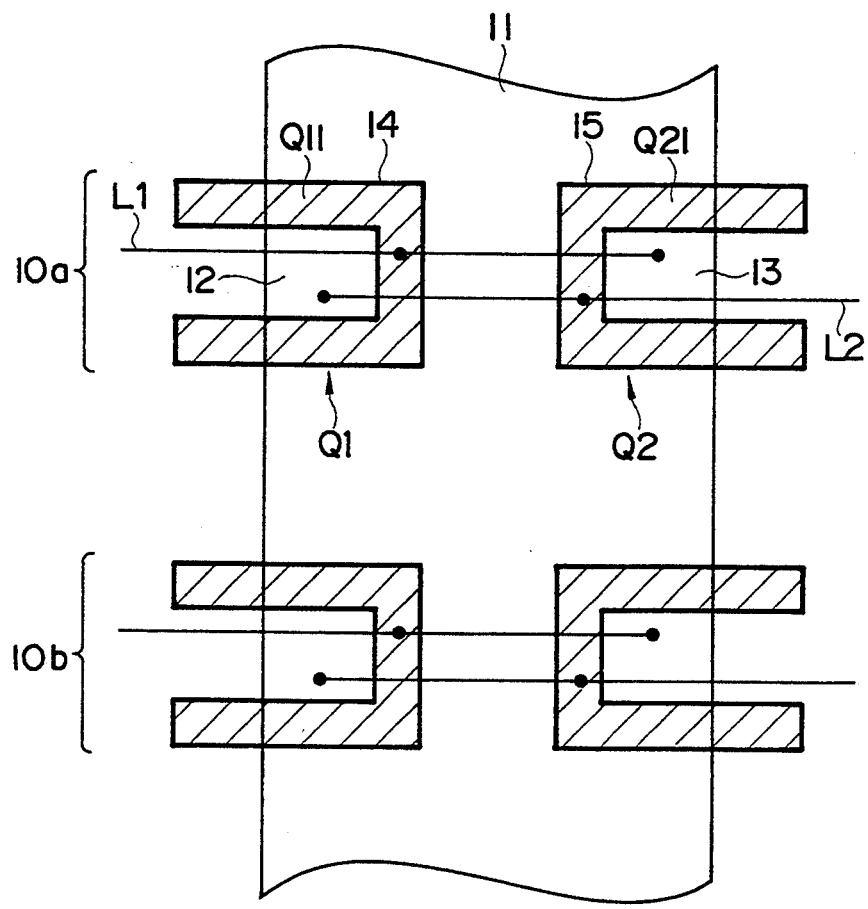
FIG. 1 is an explanatory view showing a pattern arrangement of a semiconductor device according to a first embodiment of this invention.
Figure 3:
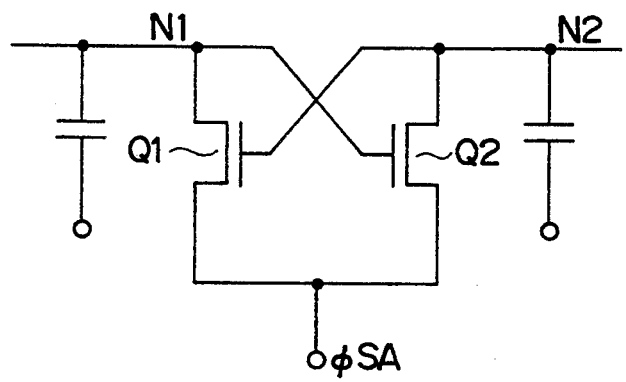
FIG. 3 is a circuit diagram showing a basic circuit configuration of a conventional semiconductor device.
Figure 4:
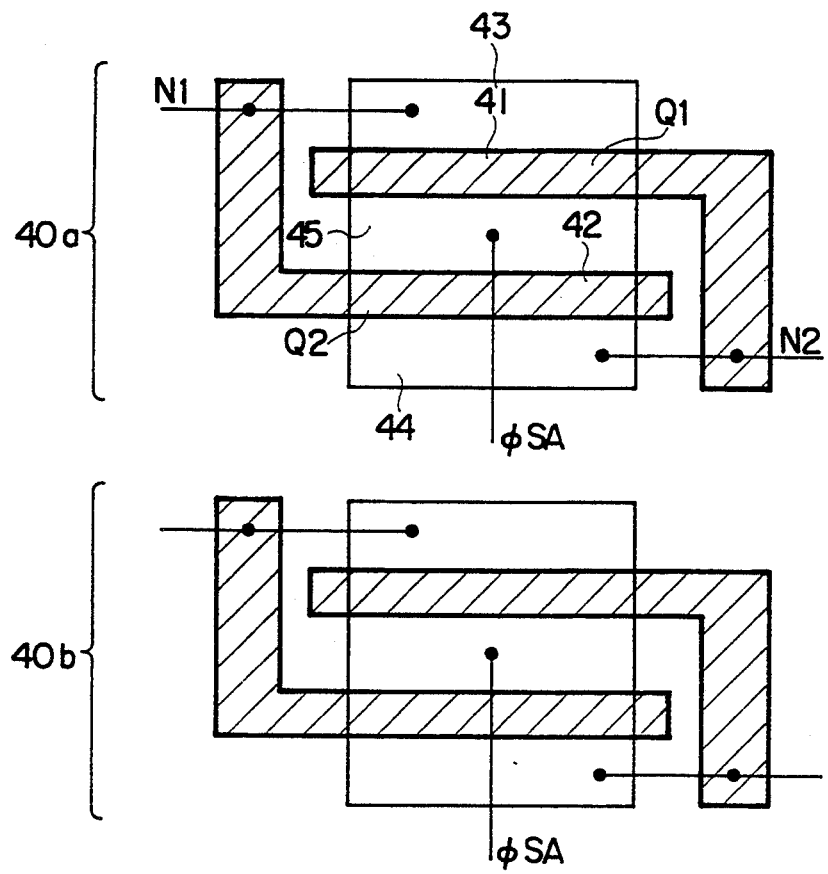
FIG. 4 is an explanatory view of a pattern arrangement of the device shown in FIG. 3.

A pattern arrangement of a semiconductor device according to a first embodiment is shown in FIG. 1. Here, the basic circuit configurations of respective sense circuits 10a, 10b, ... are the same as those of the above-described device shown in FIG. 3. Namely, the device according to this embodiment is characterized in the pattern arrangement modified as described below when compared to the conventional device.

MOS transistors Q1 and Q2, included in the sense circuits, are formed in one of the transistor regions Q11 and Q21, respectively. The transistor regions Q11 and Q21 respectively include a drain region 12 and a drain region 13, and source regions (hereinafter generically called a source region 11) are commonly connected. Further, a gate 14 of the MOS transistor Q1 and a drain region 13 of the MOS transistor Q2 are connected through a wiring layer L1 indicated by the solid line in the figure for convenience, and a gate 15 of the MOS transistor Q2 and a drain region 12 of the MOS transistor Q1 are connected through a wiring layer L2 similarly indicated by the solid line. In addition, respective channel regions in the transistor regions Q11 and Q21 are, below the gate electrodes 14 and 15, in a U-shaped form similar to the form of these gate electrodes.

Respective sense circuits 10a, 10b, ..., thus constructed, are arranged in a direction running through the bit line (in a longitudinal direction in the figure), and share the source region 11. Since there is in this embodiment a structure such that respective sense circuits share the source region 11, the necessity of carrying out element isolation is excluded.

Since it is unnecessary to provide element isolation regions (isolation regions between sense circuits), in the case where miniaturization is carried out, areas forming respective regions can be larger than those in the prior art. Since the source region 11 is formed in the state shared by all the sense circuits 10a, 10b, ..., it is possible to take a larger area as a matter of course. Further, also with respect to the drain, regions 12 and 13, since the element isolation region (the isolation region between adjacent transistor elements constituting each sense circuit) is unnecessary, and there is an area margin in the source region 11, the area therefore can be larger than that in the prior art.

For this reason, by employing a method of injecting impurities into respective regions thereafter to sufficiently carry out thermal diffusion, or the like, the impurity concentration can be more uniform. Further, respective contact areas in the source region and the drain region can be larger than those in the prior art. For this reason, the contact resistance can be a small and uniform value. In addition, it is also possible to take a margin for absorbing deviation of mask positioning occurring in forming respective layers. As a result, miniaturization of the device can be satisfactorily conducted, and the production yield and the transistor characteristic can be improved.

Figure 2:
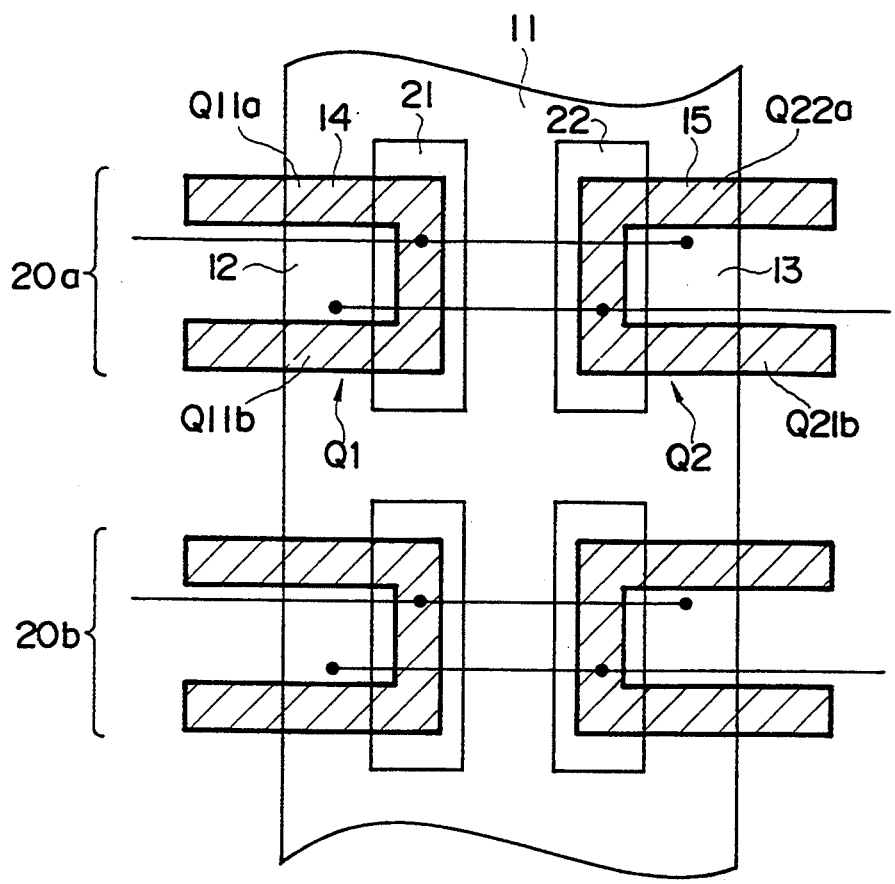
FIG. 2 is an explanatory view showing a pattern arrangement of a semiconductor device according to a second embodiment of this invention.

A second embodiment of this invention will now be described with reference to FIG. 2 showing the pattern arrangement. Unlike the above-described first embodiment, in this embodiment, element isolation regions 21 and 22 (isolation regions between adjacent transistor elements constituting respective sense circuits) are formed below the central portions of respective U-shaped gate electrodes 14 and 15, respectively. In this case, channel regions are formed below the gate electrodes 14 and 15 in the state separated into two sections by the element isolation regions 21 and 22. For this reason, e.g., in the transistor Q1, two separate channel regions are formed below the gate electrode 14, and two transistor regions Q11a and Q11b are connected in parallel in a manner whereby they share the drain region 12 and the source region 11. Also in the other transistor Q2, two transistor regions Q21a and Q21b are similarly arranged in the state whereby they are connected in parallel.

Since other portions of the pattern arrangement are the same as those of the first embodiment, their explanation is omitted here.

By forming such element isolation regions 21 and 22, even in the case where there occurs any deviation of mask positioning between respective diffused layers in the sense circuit, it is possible to prevent the contacts from being uniform. Also in the second embodiment, respective sense circuits 20a, 20b, ... share the source region 11 similarly to the first embodiment, so the element isolation region between sense circuits is unnecessary. For this reason, miniaturization of the device can be attained, and both production yield and performance improved.

It is to be noted that the above-described embodiments are both considered as examples, and do not limit this invention. For example, in the first embodiment, the MOS transistors Q1 and Q2, respectively, one of transistor regions Q11 and Q21; and in the second embodiment, those transistors respectively include two transistor regions Q11a and Q11b, and Q21a and Q21b connected in parallel. However, there may be employed a configuration such that respective MOS transistors Q1 and Q2 include three transistor regions or more.

What is claimed is:

1. A semiconductor device comprising two or more sense circuits, each sense circuit including first and second MOS transistors such that their sources are commonly connected, and that the drain of one transistor and the gate of the other transistor are connected so that they are cross-coupled with each other, to thus sense a difference between potentials applied to the respective gates, wherein each sense circuit's first and second MOS transistors include a single drain region, a single gate region and two or more channel regions connected in parallel, respectively, each sense circuit's first and second MOS transistors being disposed with their source regions being shared among said two or more sense circuits, said two or more sense circuits being disposed in such a manner that they share the respective source regions of each sense circuit's first and second MOS transistors.

* * * * *